United States Patent [19]
Nukami et al.

[11] Patent Number: 5,441,697
[45] Date of Patent: Aug. 15, 1995

[54] METHOD OF PRODUCING TiC WHISKERS AND METALLIC COMPOSITES REINFORCED BY TiC WHISKERS

[75] Inventors: Tetsuya Nukami, Susono; Tetsuya Suganuma, Nagoya, both of Japan

[73] Assignee: Toyota Jidosha Kabushiki Kaisha, Japan

[21] Appl. No.: 102,211

[22] Filed: Aug. 5, 1993

[30] Foreign Application Priority Data

| Aug. 6, 1992 | [JP] | Japan | 4-231383 |
| Jul. 9, 1993 | [JP] | Japan | 5-194052 |

[51] Int. Cl.[6] .......................................... C22C 21/00
[52] U.S. Cl. .................................. 420/528; 75/10.18; 75/683; 148/437; 420/552; 420/590
[58] Field of Search ............... 75/10.18, 683; 148/437; 420/528, 552, 590

[56] References Cited

U.S. PATENT DOCUMENTS

| 4,248,630 | 3/1981 | Balmuth | 420/528 |
| 4,383,970 | 5/1983 | Komuro et al. | 420/528 |
| 4,710,348 | 12/1987 | Brupbacher et al. | 420/129 |
| 4,748,001 | 5/1988 | Banerji et al. | 420/528 |
| 4,808,372 | 2/1989 | Koczak et al. | 420/590 |

FOREIGN PATENT DOCUMENTS

| 0258510A1 | 3/1988 | European Pat. Off. |
| 0346771A1 | 12/1989 | European Pat. Off. |
| 58-60700 | 4/1983 | Japan |
| 2-44070 | 2/1990 | Japan |
| 3-208897 | 9/1991 | Japan |

*Primary Examiner*—David A. Simmons
*Assistant Examiner*—Robert R. Koehler
*Attorney, Agent, or Firm*—Finnegan, Henderson, Farabow, Garrett & Dunner

[57] ABSTRACT

Very fine TiC whiskers having a mean diameter smaller than 1 micron are generated by pellets including Ti powder and graphite powder being added to a molten mass of pure Al or an Al alloy, or by a graphite powder being added to a molten mass of an Al alloy containing Ti, with argon gas being blown into the molten mass so as thereby to generate TiC whiskers in void spaces formed in the molten mass by bubbles of the gas. When the molten mass with the TiC whiskers thus formed therein is compressed, the interstices of the TiC whiskers generated in the void spaces are filled with the molten metal so as thereby to form colonial composite material portions dispersed in the molten mass, thus providing a metallic composite material reinforced by very fine TiC whiskers. The density of the colonial composite material portions can be increased by applying a filtering process to the molten mass.

22 Claims, 6 Drawing Sheets

(×300)

METHOD OF PRODUCING TIC WHISKERS AND METALLIC COMPOSITES REINFORCED BY TIC WHISKERS

BACKGROUND OF THE INVENTION

1. Field of the Invention

The present invention relates to a method of producing whiskers, particularly TiC whiskers, and also relates to a method of producing a metallic composite material reinforced by TiC whiskers.

2. Prior Art

As a method of producing TiC whiskers, there is a method conventionally known, as described in, for example, Japanese Patent Laid-open Publication 58-60700, which comprises the steps of treating a carbonic substrate with a water solution of a salt of noble metal, and supplying thereafter a gaseous mixture of titanium halide vapor and CO around the carbonic substrate, so as thereby to let TiC whiskers deposit and grow on the surface of the carbonic substrate until they attain a required size, such TiC whiskers then being collected.

By the above-mentioned method it is possible to produce TiC whiskers of a desired size within a range of 1–30 microns mean diameter and 0.5–5 mm mean length according to an appropriate selection of the noble metal element and the density of the water solution of the salt thereof.

As is well known, in order to improve the strength, tenacity and grindability of the composite material reinforced by such whiskers, it is necessary to reduce the diameter of each whisker to be as small as possible. However, no such whiskers having a mean diameter smaller than 1 micron are available by the method disclosed in the above-mentioned patent laid-open publication.

SUMMARY OF THE INVENTION

In view of the above-mentioned problems in such a conventional method of producing TiC whiskers as described in the above-mentioned laid-open publication, it is a first object of the present invention to provide an improved method of producing very fine TiC whiskers such as having a mean diameter smaller than 1 micron.

Further, it is a second object of the present invention to provide a method of producing a metallic composite material reinforced by such very fine TiC whiskers as available by the method which accomplishes the above-mentioned first object.

According to the present invention, the above-mentioned first object is accomplished by (1) a method of producing TiC whiskers, comprising the steps of adding a Ti powder and a graphite powder to a molten mass of pure A or an Al alloy together with supply of a substantially inactive gas into said molten mass so as thereby to generate TiC whiskers in void spaces formed therein by bubbles of said gas, and cooling down said molten mass to solidify said molten mass, or (2) a method of producing TiC whiskers, comprising the steps of adding a graphite powder to a molten mass of an Al alloy containing Ti together with supply of a substantially inactive gas into said molten mass so as thereby to generate TiC whiskers in void spaces formed therein by bubbles of said gas, and cooling down said molten mass to solidify said molten mass.

Further, according to the present invention the above-mentioned second object is accomplished by (3) a method of producing a metallic composite material reinforced by TiC whiskers, comprising the steps of adding a Ti powder and a graphite powder to a molten mass of pure Al or an Al alloy together with supply of a substantially inactive gas into said molten mass so as thereby to generate TiC whiskers in void spaces formed therein by bubbles of said gas, compressing said molten mass, and cooling down said molten mass to solidify said molten mass, or (4) a method of producing a metallic composite material reinforced by TiC whiskers, comprising the steps of adding a graphite powder to a molten mass of an Al alloy containing Ti together with supply of a substantially inactive gas into said molten mass so as thereby to generate TiC whiskers in void spaces formed therein by bubbles of said gas, compressing said molten mass, and cooling down said molten mass to solidify said molten mass.

According to the above-mentioned methods (1) and (3), TiC is generated by Ti of the Ti powder and C of the graphite powder reacting with one another in the molten mass of the pure Al or the Al alloy, while according to the above-mentioned methods (2) and (4), TiC is generated by Ti of the Al alloy and C of the graphite powder reacting with one another in the molten mass of the Al alloy, and the TiC thus generated forms a lot of single crystals each grown up from the free surface of the molten mass bordering a bubble of the substantially inactive gas toward the center of the bubble space isolated from the atmosphere, so that very fine TiC whiskers having a mean diameter such as 0.1–0.5 micron are produced in the form that each whisker extends from the free surface of the molten mass bordering the bubble toward the center thereof. When the molten mass thus formed with TiC whiskers generated in the bubble void spaces dispersed therein is compressed, the molten metal infiltrates into the interstices of the TiC whiskers, so that a metallic composite material generally reinforced with TiC whiskers is obtained with the TiC whiskers being concentrated at a lot of colonial portions dispersed therein but generally uniformly distributed therein.

When the molten mass formed with the TiC whiskers grown up in each void space of the bubble is processed by a filter which catches the TiC whiskers before or after the compression thereof but before it is cooled down so that a part of the molten metal is filtered out therethrough, the density of the TiC whiskers is appropriately increased as required.

When the temperature of the molten mass of pure Al or an Al alloy is lower than 1200° C., particularly lower than 1100° C., it is difficult to let TiC whiskers grow up satisfactorily, while on the other hand, when the temperature of the molten mass is higher than 1500° C., energy consumption undesirably increases. Therefore, according to an embodiment of the present invention, the temperature of the molten mass of pure Al or an Al alloy is adjusted to be in a range of 1100°–1500° C., more desirably, 1200°–1500° C.

The substantially inactive gas for use in the present invention may be any gas if it is substantially inactive. Rare gases such as argon, helium, etc., a mixture of the rare gas and nitrogen gas, or nitrogen gas may be used.

In order for each TiC crystal to grow up to a whisker of a desired diameter and a desired length, a certain time duration is of course required for the step of adding a Ti powder and a graphite powder to a molten mass of pure Al or an Al alloy together with supply of a substantially inactive gas into said molten mass or adding a graphite powder to a molten mass of an Al alloy containing Ti together with supply of a substantially inactive gas into said molten mass. Although such a time duration should be appropriately determined according to the size of the TiC whiskers produced, the quantity and temperature of the molten mass, the size of Ti powder particles and/or graphite powder particle, etc., it should desirably be 0.1–15 minutes.

In the above-mentioned methods (1) and (3), although a Ti powder and a graphite powder may be supplied to the molten mass in the natural form of powder, it is more desirable that they are preformed to a prefabricated block which is thrown into the molten mass, so that the powder particles are well dispersed in the molten mass without floating on the surface of the molten mass.

In the above-mentioned methods (2) and (4), when the Ti content of the Al alloy is lower than 0.1 wt %, it is difficult to let TiC whiskers grow up in good condition, while on the other hand, when said Ti content is higher than 5 wt %, the viscosity of the molten mass increases, provided that the temperature of the molten mass is so adjusted that the grow up of TiC whiskers would be optimized, thereby adversely affecting the growability of TiC whiskers. Therefore, in the above-mentioned methods (2) and (4), according to an embodiment thereof, the Ti content of the Al alloy should be adjusted to be in a range of 0.1–5 wt %.

When the pressure in the compression process is lower than 300 kg/cm$^2$, the molten metal is not sufficiently infiltrated into the interstices of the TiC whiskers, while when the pressure in the compression process is too high, the cost of the compression equipment undesirably increases. Therefore, the pressure in the compression process should desirably be 300–1500 kg/cm$^2$, more desirably 800–1200 kg/cm$^2$.

When the temperature of the molten mass during the compression process is lower than 700° C., the molten metal is not sufficiently infiltrated into the interstices of the TiC whiskers due to a relatively high viscosity thereof, while when the temperature of the molten mass during the compression process is too high, the mold refractories are much eroded. Therefore, the temperature of the molten mass during the compression process should desirably be 700°–950° C., more desirably 750°–950° C.

The filter for filtering a part of the molten metal out of the remaining molten mass containing the TiC whiskers may be of any type if it catches the TiC whiskers while allowing the molten metal pass therethrough. A desirable example of such filter is an element made of ceramic short fibers formed into a filtering body. A filtering element of such type will have a most desirable performance from the view point of durability and filtering efficiency when the volumetric density of the ceramic short fibers is 5–40%.

BRIEF DESCRIPTION OF THE DRAWINGS

In the accompanying drawings.

DESCRIPTION OF THE PREFERRED EMBODIMENTS

In the following, the present invention will be described in more detail with respect to some preferred embodiments thereof.

Embodiment 1

Figure 1:
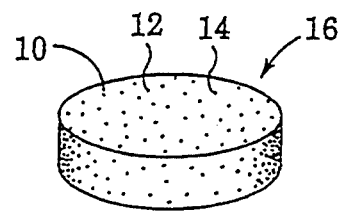
FIG. 1 is a perspective view of a pellet formed from a mixture of Ti powder, graphite powder and Al powder.
Figure 2:
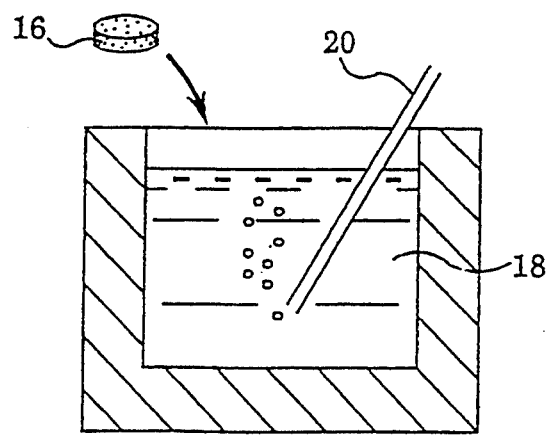
FIG. 2 is a diagrammatical illustration showing an embodiment of the method of producing TiC whiskers generated in the void spaces formed in a molten mass of metal by bubbles of a substantially inactive gas.

First, 10 pieces of pellets such as pellet 16 shown in FIG. 1 were formed from a mixture of Ti powder particles 10, graphite powder particles 12 and Al powder particles 14 mixed in a ratio of 8:2:5 by weight, so that each pellet has 30 mm diameter, 10 mm thickness and 15 g weight. Then, as shown in FIG. 2, the 10 pieces of pellets were thrown into a molten mass 18 of 500 g pure Al maintained at 1400° C., with argon gas being blown into the molten mass through a ceramic pipe 20, the blowing in of the argon gas having been continued thereafter for about 10 minutes. Then, the molten mass 18 was naturally cooled down to room temperature.

Figure 4:
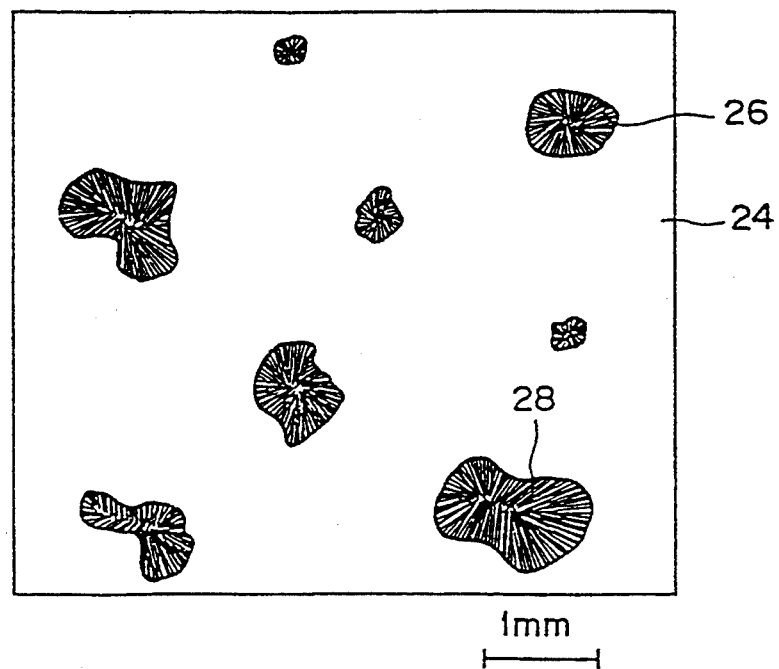
FIG. 4 is a diagrammatical illustration showing a cross section of the metallic body obtained by an embodiment of the present invention, showing particularly the TiC whiskers generated in the void spaces.

The solidified material thus obtained was cut and inspected at the cut section. As a result, it was confirmed that, as shown in FIG. 4, in the material 24 there exist a large number of voids spaces 26, in each of which there have grown up a large number of very fine whiskers 28 to extend from the surface of molten mass bordering the void space toward the center thereof. By X-ray refraction, these whiskers were confirmed to be TiC whiskers. They had a mean diameter of about 0.3 micron and a mean length of about 500 microns.

Figure 3:
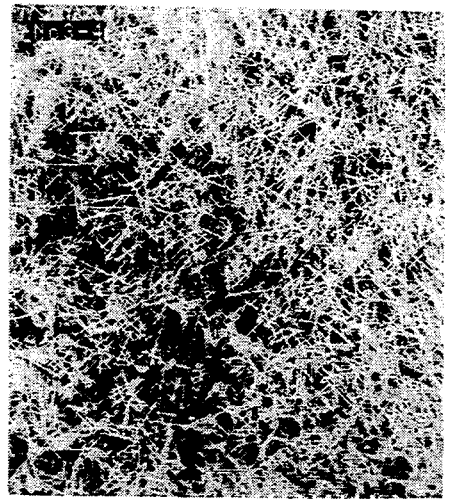
FIG. 3 is a microscopic photograph by 300 times magnification of the TiC whiskers generated in the void spaces of the molten mass of metal.

FIG. 3 is a microscopic photograph by 300 magnification of the TiC whiskers collected from the void spaces. From FIG. 3, it will be appreciated that the TiC whiskers are very fine and good in shape.

Embodiment 2

Figure 5:
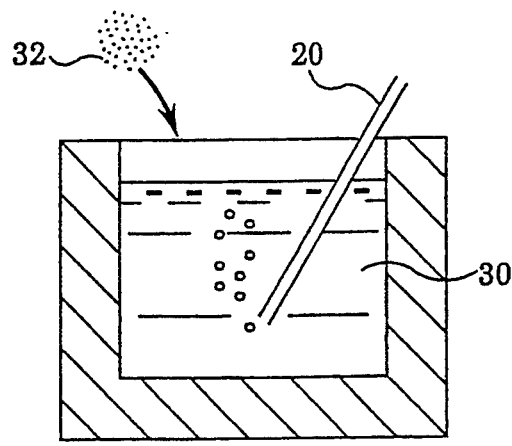
FIG. 5 is a diagrammatical illustration showing another embodiment of the method of producing TiC whiskers generated in the void spaces formed in a molten mass of metal by bubbles of a substantially inactive gas.

As shown in FIG. 5, 50 g of graphite powder 32 was put into a molten mass 30 of 500 g Al alloy (Al-3 wt % Ti) maintained at 1400° C., with argon gas being blown into the molten mass through a ceramic pipe 20, the blowing in of the argon gas having been continued thereafter for about 10 minutes. Then, the molten mass 30 was naturally cooled down to room temperature.

The solidified material thus obtained was cut and inspected at the cut section. As a result, it was confirmed that, as in Embodiment 1, there exist a large number of void spaces, in each of which there have grown up a large number of very fine whiskers to extend from the surface of the molten mass bordering the void space toward the center thereof. They had a mean diameter of about 0.3 micron and a mean length of about 500 microns.

Embodiment 3

5 pieces of the same pellets as shown in FIG. 1 were thrown, in the same manner as shown in FIG. 2, into a molten mass of 500 g pure Al maintained at 1400° C., with argon gas being blown into the molten mass through a ceramic pipe, the blowing in of the argon gas having been continued thereafter for about 20 minutes.

Figure 6:
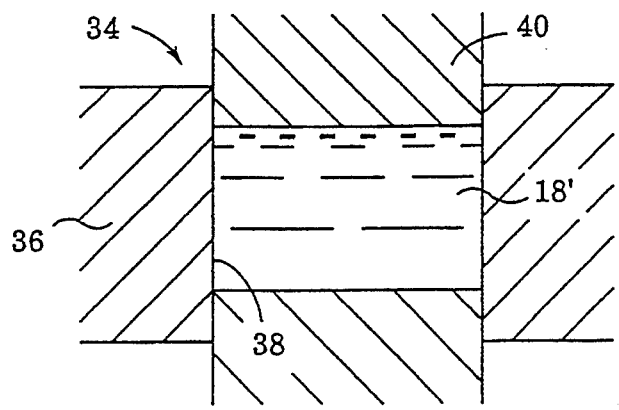
FIG. 6 is a diagrammatical illustration showing the compression process applied to the molten mass with the TiC whiskers generated therein.

Then, as shown in FIG. 6 the molten mass was compressed to a molten mass 18' at a pressure of 1000 kg/cm$^2$ in a cavity 38 defined by a mold 36 and a plunger 40 of a high pressure casting device 34. The temperature of the molten mass at the start of the compression was 800° C. The compressed molten mass 18' was naturally cooled down to room temperature.

Figure 7:
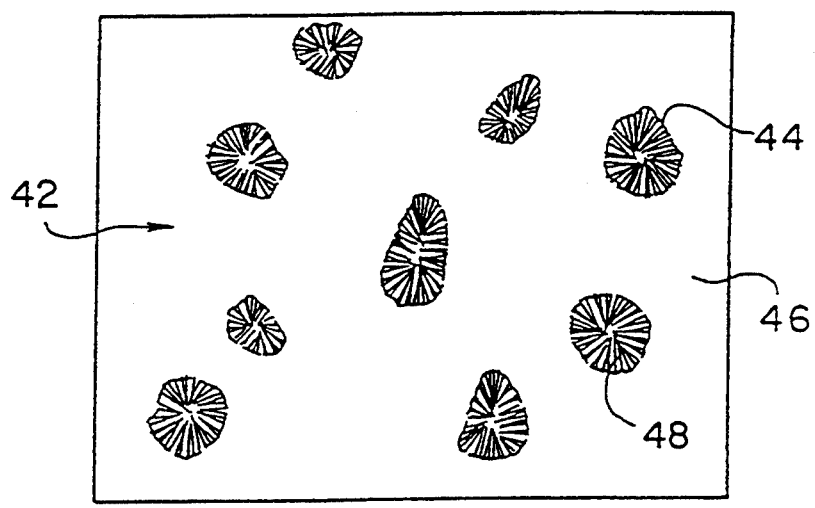
FIG. 7 is a diagrammatical illustration showing a cross section of the metallic body obtained by another embodiment of the present invention.

The solidified material thus obtained was cut and inspected at the cut section. As a result, it was confirmed that, as shown in FIG. 7, in the material 42 there exist a large number of colonial composite material portions 44 dispersed in a matrix 46 of substantially pure Al, wherein in each of the colonial composite material portions 44 a large number of very fine whiskers 48 extending from the surface of molten mass bordering the void space toward the center thereof are infiltrated with Al of the matrix 46. There existed substantially spherical TiC particles of a diameter less than 1 micron in the matrix 46.

The TiC whiskers had a mean diameter of about 0.3 micron and a mean length of about 500 microns. The volumetric ratio of the TiC whiskers 48 in the colonial composite material portion 44 was about 30%. The volumetric ratio of the colonial composite material portions 44 in the solidified material 42 was about 20%. The volumetric ratio of the TiC particles existed in the matrix 46 was about 0.2%.

Embodiment 4

5 pieces of the same pellets as shown in FIG. 1 were, in the same manner as shown in FIG. 2, thrown into a molten mass of 500 g pure Al maintained at 1400° C., with argon gas being blown into the molten mass through a ceramic pipe, the blowing in of the argon gas having been continued thereafter for about 20 minutes.

Then, in the same manner as shown in FIG. 6, the molten mass was compressed to a pressure of 1000 kg/cm$^2$ for 90 seconds in a cavity defined by a mold of a high pressure casting device. The temperature of the molten mass at the start of the compression was 800° C.

Figure 8:
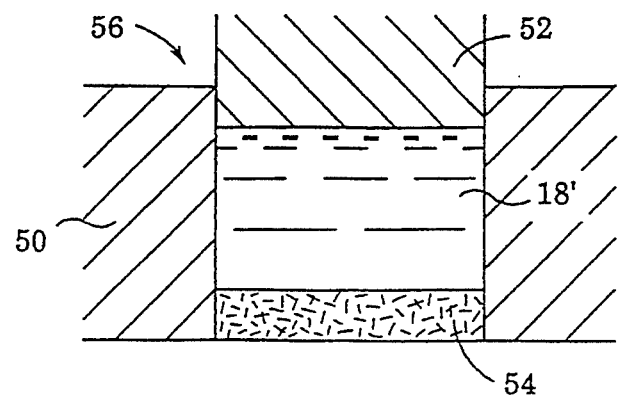
FIG. 8 is a diagrammatical illustration showing the filtering process applied to the molten mass with the TiC whiskers generated therein.

After the lapse of the 90 seconds, the compressed molten mass was poured into a filtering device 56 shown in FIG. 8, having a cylinder housing 50, a plunger 52 and a filter element 54 made of alumina-silica short fibers (50% Al$_2$O$_3$—50% SiO$_2$, 2.8 microns fiber diameter, 500 microns fiber length) arranged to have 8% volumetric density, i.e. 92% opening ratio, and the molten matrix metal was filtered out under the pressure of 500 kg/cm$^2$ through the filter element 54, while collecting the colonial composite material portions formed in the molten mass 18' by the filter element 54.

Figure 9:
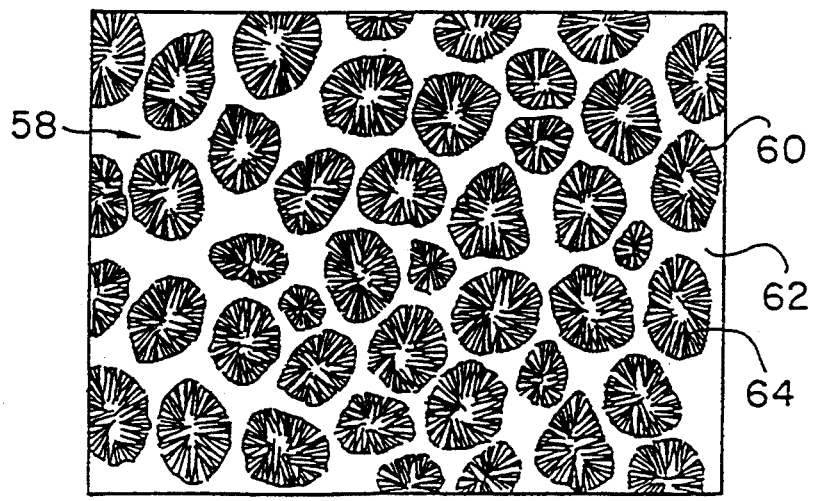
FIG. 9 is a diagrammatical illustration showing a cross section of the metallic body obtained through the filtering process applied to the molten mass with the TiC whiskers generated therein.

The material thus collected by the filter element 54 and naturally solidified was cut and inspected at the cut section. As a result, it was confirmed that, as shown in FIG. 9, in the material 58 there exist a large number of colonial composite material portions 60 closely packed with a thin layer of Al 62 filling narrow spaces among the mutually adjacent colonial composite material portions 60. In each of the colonial composite material portions 60 a large number of very fine whiskers 64 extending from the surface of molten mass bordering the void space toward the center thereof are infiltrated with Al of the matrix 62.

The TiC whiskers had a mean diameter of about 0.3 micron and a mean length of about 500 microns. The volumetric ratio of the TiC whiskers 64 in the colonial composite material portion 60 was about 30%. The volumetric ratio of the colonial composite material 60 portions in the solidified material 58 was about 80%.

Embodiment 5

In the same manner as shown in FIG. 5, 7 g of graphite powder was put into a molten mass 30 of 500 g Al alloy (Al—5 wt % Ti) maintained at 1400° C., with argon gas being blown into the molten mass through a ceramic pipe, the blowing in of the argon gas having been continued thereafter for about 20 minutes.

Then, in the same manner as shown in FIG. 6, the molten mass was compressed to 1000 kg/cm$^2$. The temperature of the molten mass at the start of the compression was 800° C. The molten mass was naturally cooled down to room temperature under the compression.

The material thus solidified was cut and inspected at the cut section. As a result, it was confirmed that, in the same manner as shown in FIG. 7, in the material there exist a large number of colonial composite material portions dispersed in a matrix of substantially pure Al, wherein in each of the colonial composite material portions a large number of very fine whiskers extending from the surface of molten mass bordering the void space toward the center thereof are infiltrated with Al of the matrix.

The TiC whiskers had a mean diameter of about 0.3 micron and a mean length of about 500 microns. The volumetric ratio of the TiC whiskers in the colonial composite material portion was about 20%. The volumetric ratio of the colonial composite material portions in the solidified material was about 20%.

Embodiment 6

In the same manner as shown in FIG. 5, 7 g of graphite powder was put into a molten mass of 500 g Al alloy (Al-5 wt % Ti) maintained at 1400° C., with argon gas being blown into the molten mass through a ceramic pipe 20, the blowing in of the argon gas having been continued thereafter for about 20 minutes.

Then, in the same manner as shown in FIG. 6, the molten mass was compressed to 1000 kg/cm$^2$ for 90 seconds. The temperature of the molten mass at the start of the compression was 800° C.

After the lapse of the 90 seconds, in the same manner as shown in FIG. 8, the compressed molten mass was poured into a filtering device of the same type as shown in FIG. 8, and the molten matrix metal was filtered out under the pressure of 500 kg/cm² through the filter element, while the colonial composite material portions formed in the molten mass by the filter element.

The material thus collected by the filter element and naturally solidified was cut and inspected at the cut section. As a result, it was confirmed that, in the same manner as shown in FIG. 9, there exist a large number of colonial composite material portions closely packed with a thin layer of Al filling narrow spaces among the mutually adjacent colonial composite material portions. In each of the colonial composite material portions a large number of very fine whiskers extending from the surface of molten mass bordering the void space toward the center thereof are infiltrated with Al of the matrix.

The TiC whiskers had a mean diameter of about 0.3 micron and a mean length of about 500 microns. The volumetric ratio of the TiC whiskers in the colonial composite material portion was about 20%. The volumetric ratio of the colonial composite material in the solidified material portions was about 80%.

Experiments of the Composite Materials Obtained

Figure 10:
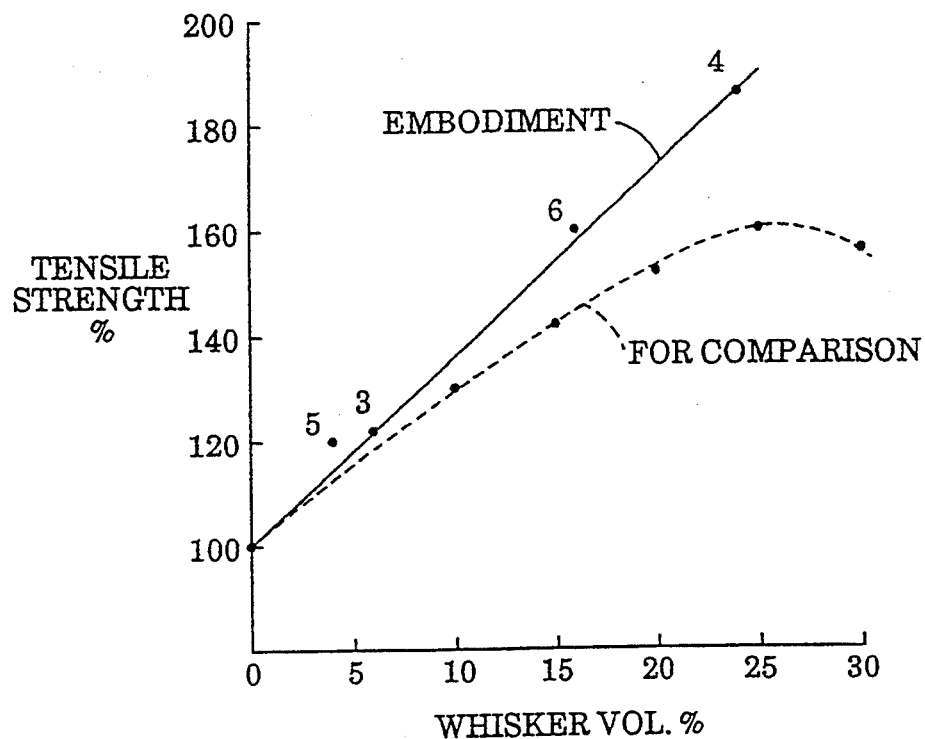
FIG. 10 is a graph showing a comparison of the tensile strength of the composite materials produced by the present invention and some composite materials for comparison purposes.

Test pieces for tensile strength were prepared from the composite materials obtained by the present invention. Further, test pieces for comparison purposes were prepared from a composite material of pure Al reinforced by 10-30 vol. % three dimensionally randomly arranged silicon carbide whiskers (0.5 micron mean fiber diameter, and 50 microns mean fiber length). The test pieces were tested with respect to the tensile strength at room temperature. The results of the tests are shown in FIG. 10, wherein the tensile strength is expressed in percentage relative to that of pure Al which is 100%.

Figure 11:
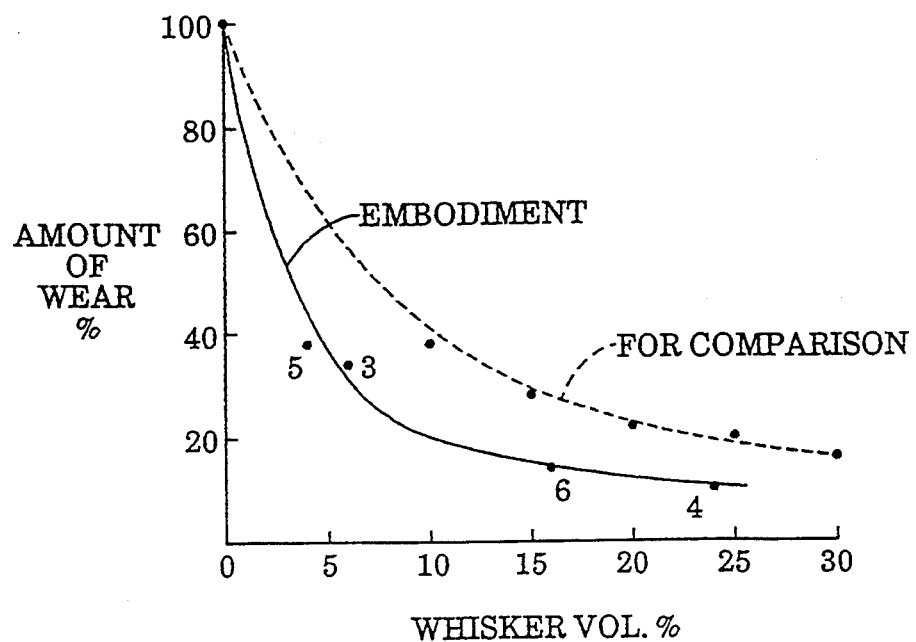
FIG. 11 is a graph showing a comparison of the wear resistance of the composite materials produced by the present invention and some composite materials for comparison purposes.

Further, disk shaped test pieces for wearing test were prepared from the composite materials obtained by the present invention and the above-mentioned comparison purposes, and were tested with respect to wear resistance by pressing an end of a cylindrical mating member in rotation against the test pieces under the conditions described below:

Test temperature: 150° C.
Mating member: bearing steel (JIS SUJ2)
Lubricant: Castle Motor Oil (5W-30) (Reg. TM)
Load: 50 kgf
Revolution: 150 rpm
Test duration: one hour The results of the tests are shown in FIG. 11, wherein the amount of wear measured as the depth of a wear trace formed in the surface of the test piece is expressed in percentage relative to that of pure Al which is 100%.

Figure 12:
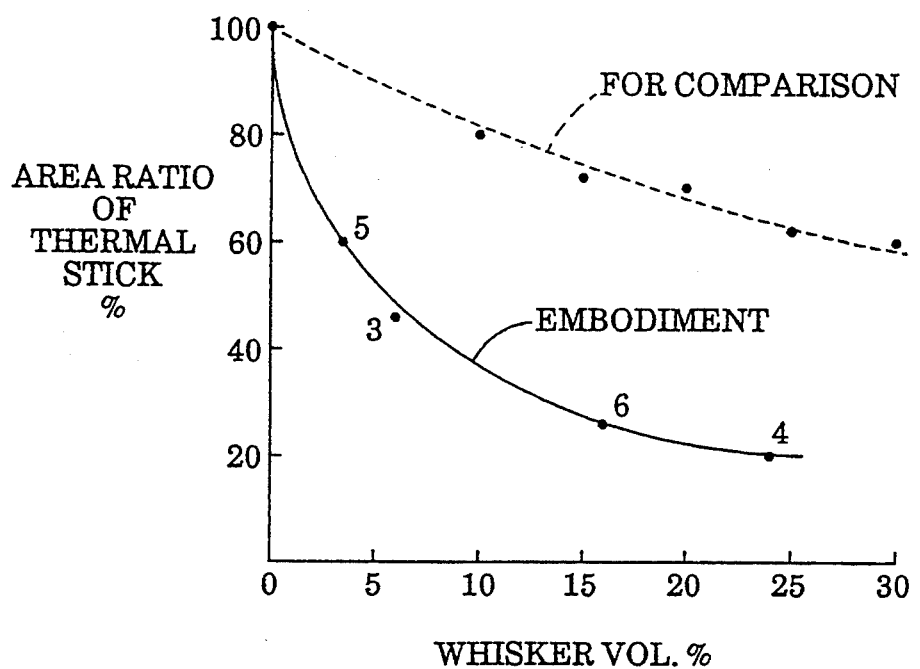
FIG. 12 is a graph showing a comparison of the resistance to thermal sticking of the composite materials produced by the present invention and some composite materials for comparison purposes.

Further, square bar shaped test pieces for thermal sticking were prepared from the composite materials obtained by the present invention and the above-mentioned comparison purposes, and were tested with respect to resistance to thermal sticking by bumping an end of the test piece against a mating member under the conditions described below:

Test temperature: 250° C.
Mating member: bearing steel (JIS SUJ2)
Test surface area: 750 cm²
Bump load: 5 kgf The results of the tests are shown in FIG. 12, wherein the ratio of the area at which the material of the test piece stuck to the test surface to the test surface area is expressed in percentage relative to that of pure Al which is 100%.

From FIG. 10 it will be appreciated that the composite materials of Embodiments 3 and 5 have the tensile strength comparable with the composite material for comparison purposes, while the composite materials of Embodiments 4 and 6 are superior to the composite materials for comparison purposes and much superior to those of Embodiments 3 and 5 in the tensile strength. Further, from FIGS. 11 and 12 it will be appreciated that the composite materials according to the present invention are superior to the composite materials for comparison purposes in the wear resistance, and are much superior to the composite material for comparison purposes in the resistance to thermal sticking. It will also be appreciated that the composite materials of Embodiments 4 and 6 are superior to those of Embodiments 3 and 5 in both the wear resistance and the resistance to thermal sticking.

It is guessed that the above-mentioned superior performance of the composite material according to the present invention was available because the TiC whiskers in the composite material according to the present invention are not simply three dimensionally randomly dispersed in the matrix of composite material but are highly regularly three dimensionally radially oriented in each of the colonial composite material portions so as to provide strong core materials which, on the other hand, are uniformly dispersed in a matrix of Al or uniformly packed with relatively thin binding matrix layers intimately filling the interstices between the adjacent colonial composite material portions.

Although the present invention has been described in detail in the above with respect to some particular embodiments thereof, it will be apparent to those skilled in the art that various other embodiments are possible within the scope of the present invention.

For example, although in the above embodiments, after the TiC whiskers had been grown up in the void spaces of pure Al or an Al alloy, the molten mass was compressed before it is cooled down to solidify, a similar composite material will be obtained by once letting the molten mass formed with the TiC whiskers in the void spaces thereof be cooled down to solidify, then by reheating the solidified mass to melt and compressing the molten mass.

Further, although in the above Embodiments 4 and 6 the molten mass with the TiC whiskers formed in the void spaces was compressed and then filtered, the molten mass formed the TiC whiskers with in the void spaces may be first filtered and then compressed, or the filtering process may be carried out both before and after the compression process.

Further, although pure Al or Al—Ti alloy was used in the above embodiments, it was also confirmed that the same favorable results are available when the molten metal is other Al alloys containing one or more elements selected from Cu, Si, Mg, Zn or the like, such as JIS 2024, 6061, 7075 and AC8A.

As will be appreciated from the foregoing, according to the present invention, Ti and C react with one another in the molten mass to generate TiC, and the thus generated TiC grows up to form a number of single crystals each extending from the surface of the molten mass bordering a bubble space of a substantially inactive gas formed in the molten mass toward the center thereof under a condition of being isolated from the atmosphere, whereby very fine whiskers are generated such as to have a mean diameter of the order of 0.1–0.5 microns.

Further, when the molten mass with the colonial composite material portions formed in the matrix metal is processed by filtration, a TiC whisker reinforced metallic composite material is available to have a substantially high fiber density as compared with those available according to the conventional methods.

We claim:

1. A method of producing a TiC microstructure, comprising the steps of adding a Ti powder and a graphite powder to a molten mass of pure Al or an Al alloy, injecting a supply of an inactive gas into said molten mass to generate void spaces formed by bubbles of said gas in said molten mass wherein TiC is formed as TiC whiskers in said void spaces, and cooling down said molten mass to solidify said molten mass containing said TiC whiskers.

2. A method according to claim 1, wherein the temperature of said molten mass of pure Al or an Al alloy into which a Ti powder and a graphite powder are added is in a range of 1100°–1500° C.

3. A method according to claim 1, wherein the temperature of said molten mass of pure Al or an Al alloy into which a Ti powder and a graphite powder are added is in a range of 1200°–1500° C.

4. A method of producing a TiC microstructure, comprising the steps of adding a graphite powder to a molten mass of an Al alloy containing Ti, injecting a supply of an inactive gas into said molten mass to generate void spaces formed by bubbles of said gas in said molten mass wherein TiC is formed as TiC whiskers in said void spaces, and cooling down said molten mass to solidify said molten mass containing said TiC whiskers.

5. A method according to claim 4, wherein the temperature of said molten mass of pure Al or an Al alloy into which a Ti powder and a graphite powder are added is in a range of 1100°–1500° C.

6. A method according to claim 4, wherein the temperature of said molten mass of pure Al or an Al alloy into which a Ti powder and a graphite powder are added is in a range of 1200°–1500° C.

7. A method of producing a metallic composite reinforced by TiC whiskers, comprising the steps of adding a Ti powder and a graphite powder to a molten mass of pure Al or an Al alloy, injecting a supply of an inactive gas into said molten mass to generate void spaces formed by bubbles of said gas in said molten mass wherein TiC is formed as TiC whiskers in said void spaces, compressing said molten mass, and cooling down said molten mass to solidify said molten mass containing said TiC whiskers.

8. A method according to claim 7, wherein the temperature of said molten mass of pure Al or an Al alloy into which a Ti powder and a graphite powder are added is in a range of 1100°–1500° C.

9. A method according to claim 7, wherein the temperature of said molten mass of pure Al or an Al alloy into which a Ti powder and a graphite powder are added is in a range of 1200°–1500° C.

10. A method according to claim 1, wherein said molten mass with the TiC whiskers formed therein is filtered to remove a part of the molten pure Al or Al alloy so as thereby to increase the density of the TiC whiskers in the molten mass.

11. A method according to claim 7, wherein the temperature of said molten mass subjected to the compression is in a range of 700°–950° C.

12. A method according to claim 7, wherein the temperature of said molten mass subjected to the compression is in a range of 750°–950° C.

13. A method of producing a metallic composite reinforced by TiC whiskers, comprising the steps of adding a graphite powder to a molten mass of an Al alloy containing Ti, injecting a supply of an inactive gas into said molten mass to generate void spaces formed by bubbles of said gas in said molten mass wherein TiC is formed as TiC whiskers in said void spaces, compressing said molten mass, and cooling down said molten mass to solidify said molten mass containing said TiC whiskers.

14. A method according to claim 13, wherein the temperature of said molten mass of pure Al or an Al alloy into which a Ti powder and a graphite powder are added is in a range of 1100°–1500° C.

15. A method according to claim 1, wherein the temperature of said molten mass of pure Al or an Al alloy into which a Ti powder and a graphite powder are added is in a range of 1200°–1500° C.

16. A method according to claim 13, wherein said molten mass with the TiC whiskers formed therein is filtered to remove a part of the molten Al alloy so as thereby to increase the density of the TiC whiskers in the molten mass.

17. A method according to claim 13, wherein the temperature of said molten mass subjected to the compression is in a range of 700°–950° C.

18. A method according to claim 13, wherein the temperature of said molten mass subjected to the compression is in a range of 750°–950° C.

19. A method of claim 7, wherein the molten mass is compressed within the range of 300–1500 kg/cm$^2$.

20. A method of claim 7, wherein the molten mass is compressed within the range of 800–1200 kg/cm$^2$.

21. A method of claim 13, wherein the molten mass is compressed within the range of 300–1500 kg/cm$^2$.

22. A method of claim 13, wherein the molten mass is compressed within the range of 800–1200 kg/cm$^2$.

* * * * *